(12) United States Patent
Aihara

(10) Patent No.: US 12,384,077 B2
(45) Date of Patent: Aug. 12, 2025

(54) IMPRINT APPARATUS, METHOD OF MANUFACTURING ARTICLE, PLANARIZED LAYER FORMING APPARATUS, INFORMATION PROCESSING APPARATUS, AND DETERMINATION METHOD

(71) Applicant: CANON KABUSHIKI KAISHA, Tokyo (JP)

(72) Inventor: Sentaro Aihara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1 day.

(21) Appl. No.: 18/153,508

(22) Filed: Jan. 12, 2023

(65) Prior Publication Data

US 2023/0166430 A1    Jun. 1, 2023

Related U.S. Application Data

(62) Division of application No. 16/411,648, filed on May 14, 2019, now Pat. No. 11,577,433.

(30) Foreign Application Priority Data

May 17, 2018  (JP) ................. 2018-095633

(51) Int. Cl.
*B29C 41/34* (2006.01)
*B29C 71/00* (2006.01)
*H01L 21/027* (2006.01)

(52) U.S. Cl.
CPC .......... *B29C 41/34* (2013.01); *B29C 71/0009* (2013.01); *H01L 21/027* (2013.01)

(58) Field of Classification Search
CPC .................................. B29C 41/34
See application file for complete search history.

(56) References Cited

U.S. PATENT DOCUMENTS 6,334,960 B1   1/2002   Willson
7,360,851 B1   4/2008   Snyder
(Continued)

FOREIGN PATENT DOCUMENTS

CN   102419512 B  *  7/2013  ............. B82Y 10/00
CN   105137714 A     12/2015
(Continued)

OTHER PUBLICATIONS

Machine translation JP2016009798A (Year: 2016).*
(Continued)

*Primary Examiner* — Abbas Rashid
*Assistant Examiner* — Wayne K. Swier
(74) *Attorney, Agent, or Firm* — ROSSI, KIMMS & McDOWELL LLP

(57) ABSTRACT

An imprint apparatus that brings a mold and an imprint material on a substrate into contact with each other to form a pattern of the imprint material on the substrate is provided. The apparatus comprises a supplying unit configured to supply the imprint material to the substrate, and a control unit configured to control the supplying unit in accordance with arrangement data of the imprint material that indicates a position where the imprint material is to be supplied on the substrate, wherein the control unit determines the arrangement data based on a feature related to a spread of a droplet of the imprint material on the substrate.

7 Claims, 17 Drawing Sheets

(56) References Cited

U.S. PATENT DOCUMENTS

| | | |
|---|---|---|
| 9,804,503 B2 | 10/2017 | Tanaka |
| 9,941,137 B2 | 4/2018 | Takahata |
| 10,029,456 B2 | 7/2018 | Nakagawa |
| 10,451,965 B2 | 10/2019 | Yamazaki |
| 2004/0065976 A1 | 4/2004 | Sreenivasan |
| 2009/0140445 A1 | 6/2009 | Lu |
| 2013/0020281 A1 | 1/2013 | Wakamatsu |
| 2015/0017329 A1 | 1/2015 | Fletcher |
| 2016/0271845 A1 | 9/2016 | Yamazaki |
| 2016/0306281 A1 | 10/2016 | Hamaya |
| 2016/0351409 A1 | 12/2016 | Takahata |
| 2018/0017863 A1 | 1/2018 | Sakai |
| 2018/0117796 A1 | 5/2018 | Demura |

FOREIGN PATENT DOCUMENTS

| | | |
|---|---|---|
| JP | 2013161893 A | 8/2013 |
| JP | 2014120697 A | 6/2014 |
| JP | 2015153953 A | 8/2015 |
| JP | 2016009798 A | 1/2016 |
| JP | 2016178127 A | 10/2016 |
| JP | 2016219679 A | 12/2016 |
| KR | 1020130108124 A | 10/2013 |
| WO | WO-2012133955 A2 * | 10/2012 ............. B82Y 10/00 |
| WO | 2016159312 A1 | 10/2016 |
| WO | 2017010539 A1 | 1/2017 |
| WO | 2017038026 A1 | 3/2017 |

OTHER PUBLICATIONS

Machine translation CN102419512B (Year: 2013).*
Machine translation CN105137714A (Year: 2015).*
Machine translation WO2017010539A1 (Year: 2017).*
Alcocer "What is a Polygon? Definition, Shapes & Angles" Study. com, https://study.com/academy/lesson/what-is-a-polygon-definition-shapes-angles.html. 2015.
Office Action issued in U.S. Appl. No. 16/411,648 mailed on Jun. 8, 2021.
Office Action issued in Japanese Appln. No. 2018-095633 mailed on Feb. 7, 2022.
Office Action issued in U.S. Appl. No. 16/411,648 mailed on Mar. 14, 2022.
Office Action issued in U.S. Appl. No. 16/411,648 mailed on Sep. 24, 2021.
Notice of Allowance issued in U.S. Appl. No. 16/411,648 mailed on Oct. 27, 2022.

* cited by examiner

F I G. 8

| No. | MOLD TYPE | FILLING TIME [s] | IMPRINT CONTROL MODE | MEASURE-MENT POSITION [mm] (SHOT COORDINATE SYSTEM) | MEASURE-MENT POSITION [mm] (WAFER COORDINATE SYSTEM) | MATERIAL OF IMPRINT MATERIAL | MATERIAL OF SUBSTRATE COATING MATERIAL | FLOW RATE OF ATMOS-PHERIC FLUID | FEATURES OF SHAPE OF SPREAD | | | |
|---|---|---|---|---|---|---|---|---|---|---|---|---|
| | | | | | | | | | LW[μm] | LH[μm] | CW[μm] | CH[μm] | ANG [degree] |
| A | PLANE | 2 | Standard | X:0, Y:0 | X:0, Y:0 | A | A | Standard | 100 | 200 | 200 | 100 | 0 |
| B | Line&Space | 2 | Standard | X:0, Y:0 | X:0, Y:0 | A | A | Standard | 100 | 100 | 200 | 100 | 0 |
| C | Line&Space | 1 | Fast | X:0, Y:0 | X:0, Y:0 | A | A | Standard | 50 | 160 | 100 | 50 | 0 |
| D | Line&Space | 2 | Standard | X:13, Y:17.5 | X:150 Y:17.5 | A | A | Standard | 80 | 100 | 160 | 80 | 0 |
| E | Line&Space | 2 | Standard | X:0, Y:0 | X:0, Y:0 | B | A | Standard | 120 | 220 | 220 | 120 | 0 |
| F | Line&Space | 2 | Standard | X:0, Y:0 | X:0, Y:0 | A | B | Standard | 120 | 220 | 220 | 120 | 0 |
| G | Line&Space | 2 | Standard | X:0, Y:0 | X:0, Y:0 | A | A | Fast | 50 | 160 | 100 | 50 | 0 |
| H | Line&Space (TILTED) | 2 | Standard | X:0, Y:0 | X:0, Y:0 | A | A | Fast | 100 | 200 | 200 | 100 | 45 |

FIG. 12
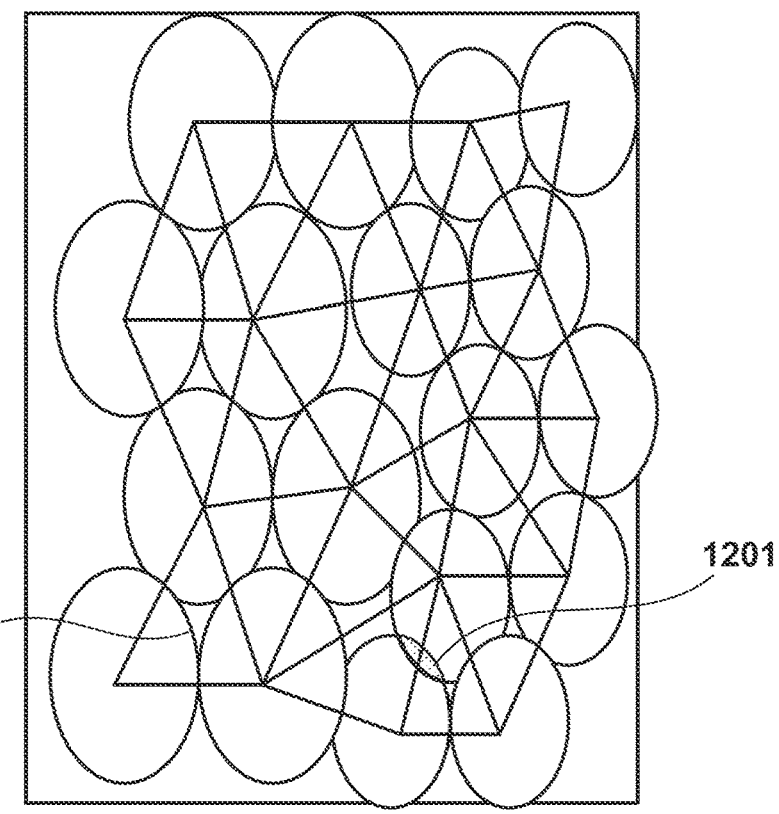
FIG. 13A
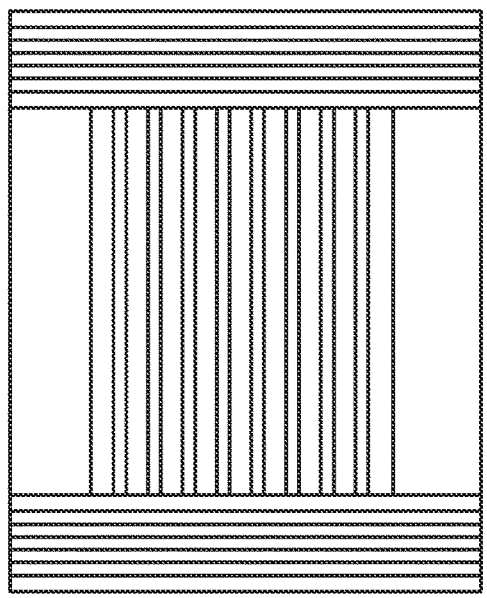
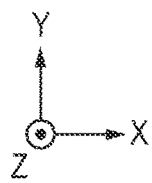
FIG. 13B
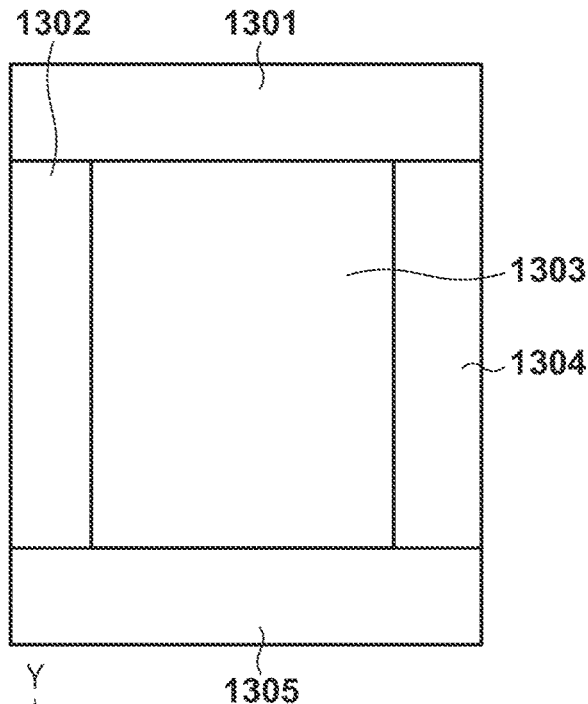
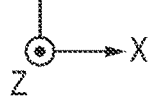

F I G. 17

| No. | MOLD TYPE | FILLING TIME [s] | IMPRINT CONTROL MODE | MEASURE-MENT POSITION [mm] (SHOT COORDINATE SYSTEM) | MEASURE-MENT POSITION [mm] (WAFER COORDINATE SYSTEM) | MATERIAL OF IMPRINT MATERIAL | MATERIAL OF SUBSTRATE COATING MATERIAL | FLOW RATE OF ATMOS-PHERIC FLUID | FEATURES OF SHAPE OF SPREAD LW[μm] | LH[μm] | CW[μm] | CH[μm] | ANG [degree] |
|---|---|---|---|---|---|---|---|---|---|---|---|---|---|
| A | Line&Space (Vertical) | 1 | Fast | X:0, Y:0 | X:0, Y:0 | A | A | Standard | 50 | 100 | 100 | 50 | 0 |
| B | Line&Space (Horizontal) | 1 | Fast | X:0, Y:0 | X:0, Y:0 | A | A | Standard | 100 | 50 | 50 | 100 | 0 |
| C | Plane | 1 | Fast | X:0, Y:0 | X:0, Y:0 | A | A | Standard | 100 | 100 | 100 | 100 | 0 |
| D | Border (L&S Vertical between L&S Horizontal) | 1 | Fast | X:0, Y:0 | X:0, Y:0 | A | A | Standard | 75 | 75 | 75 | 75 | 0 |
| E | Border (L&S Vertical between Plane) | 1 | Fast | X:0, Y:0 | X:0, Y:0 | A | A | Standard | 75 | 100 | 100 | 75 | 0 |
| F | Border (L&S Horizontal between Plane) | 1 | Fast | X:0, Y:0 | X:0, Y:0 | A | A | Standard | 100 | 75 | 75 | 100 | 0 |

IMPRINT APPARATUS, METHOD OF MANUFACTURING ARTICLE, PLANARIZED LAYER FORMING APPARATUS, INFORMATION PROCESSING APPARATUS, AND DETERMINATION METHOD

BACKGROUND OF THE INVENTION

Field of the Invention

The present invention relates to an imprint apparatus, a method of manufacturing an article, a planarized layer forming apparatus, an information processing apparatus, and a determination method.

Description of the Related Art

An imprint apparatus forms an imprint material pattern on the substrate by curing an imprint material in a state in which a mold and the imprint material on a substrate are in contact with each other and separating the mold from the cured imprint material.

Since the required amount of the imprint material and the spread of the imprint material will vary depending on the mold, the imprint material needs to be supplied onto the substrate in an arrangement suitable for the mold. Hence, in an imprint apparatus, an imprint material supply pattern suitable for the mold is determined, and the imprint material is arranged on the substrate in accordance with the determined supply pattern.

For example, in US-2004-0065976, there is disclosed a method of generating an imprint material supply pattern based on information of the pattern density for each local region of a mold.

In the method of generating an imprint material supply pattern according to the related art, conditions such as the design information of a mold, the thickness of an adhesion layer on a substrate, and the like are set, and a supply pattern is generated based on these conditions. However, when an imprint process is to be actually performed, the way the imprint material spreads can vary due to differences in imprint control methods and influences from the atmosphere in contact with the imprint material and the like. It is not easy to accurately calculate the difference in the way the imprint material spreads because the difference occurs due to a combination of various factors. Hence, it is necessary to consider the influence generated on the imprint material at the execution of an imprint process. When a supply pattern generated by the method according to the related art is used, the imprint material does not spread sufficiently, and the residual layer thickness formed on the substrate becomes uneven. This can cause a pattern defect.

SUMMARY OF THE INVENTION

The present invention provides, for example, a technique advantageous in reducing a pattern defect.

The present invention in its one aspect provides an imprint apparatus that brings a mold and an imprint material on a substrate into contact with each other to form a pattern of the imprint material on the substrate, comprising a supplying unit configured to supply the imprint material to the substrate, and a control unit configured to control the supplying unit in accordance with arrangement data of the imprint material that indicates a position where the imprint material is to be supplied on the substrate, wherein the control unit determines the arrangement data based on a feature related to a spread of a droplet of the imprint material on the substrate.

Further features of the present invention will become apparent from the following description of exemplary embodiments (with reference to the attached drawings).

BRIEF DESCRIPTION OF THE DRAWINGS

FIG. 8 is a view showing an example of a feature table;

FIG. 12 is a view for explaining the imprint material arrangement position determination processing;

FIGS. 13A and 13B are views showing examples of molds that include plurality of different patterns;

FIG. 17 is a view showing an example of a feature table;

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

First Embodiment

The outline of an imprint apparatus according to this embodiment will now be described. The imprint apparatus is an apparatus for bringing an imprint material supplied onto a substrate into contact with a mold, applying curing energy to the imprint material, and forming a pattern of the cured product to which a concave-convex pattern of the mold is transferred.

As an imprint material, a curable composition (to be also referred to uncured resin) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, visible light, and ultraviolet light. The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

Figure 1:
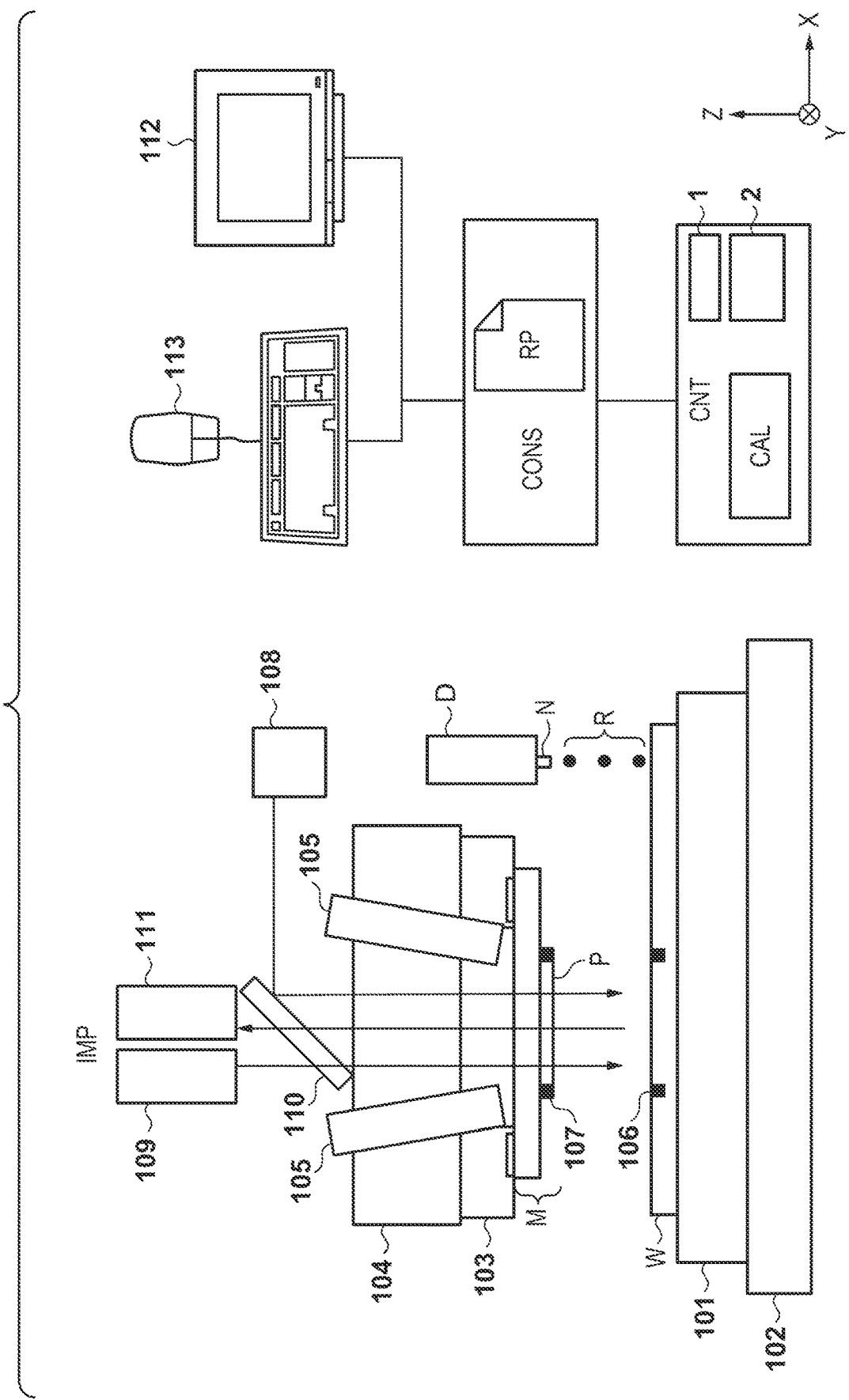
FIG. 1 is a view showing the arrangement of an imprint apparatus according to an embodiment.

FIG. 1 shows the arrangement of an imprint apparatus IMP according to this embodiment. Note that in this specification and the accompanying drawings, directions are indicated in an XYZ coordinate system in which directions parallel to the surface of a substrate W are set as an X-Y plane. In addition, in this embodiment, assume that the imprint apparatus IMP employs, as an imprint material curing method, a photo-curing method of curing an imprint material by ultraviolet irradiation. Hence, an ultraviolet light curable imprint material that is cured by ultraviolet irradiation will be used as the imprint material in this embodiment. However, the present invention is not limited to this. It is possible to use, for example, a heat-curable imprint material and employ a heat-curing method of curing an imprint material by applying heat.

The imprint apparatus IMP includes a substrate holder 101 for holding the substrate W and a substrate stage 102 for supporting and moving the substrate holder 101. The imprint apparatus IMP also includes a mold holder 103 for holding a mold M on which a pattern P is formed and a mold driver 104 for supporting and moving the mold holder 103. The imprint apparatus IMP also includes a supplying unit (dispenser) D that supplies an imprint material R onto the substrate W, a controller CNT that controls an imprint operation, and a console unit CONS that generates an operation screen. Furthermore, the imprint apparatus IMP includes a display device 112 for displaying the operation screen and an input device 113 such as a keyboard and a mouse. The controller CNT can be formed by, for example, a computer device which includes a CPU 1 and a memory (storage unit) 2. The CPU 1 can control the imprint operation by executing a control program stored in the memory 2. As shown in FIG. 1, the console unit CONS manages a supply pattern (an application pattern, a map, or the like) RP indicating positions where the imprint material needs to be supplied on a substrate. The data of the supply pattern RP (arrangement data) may be stored in the memory 2 of the controller CNT. In this embodiment particularly, the controller CNT controls the supplying unit D in accordance with an imprint material supply pattern.

Figure 2:
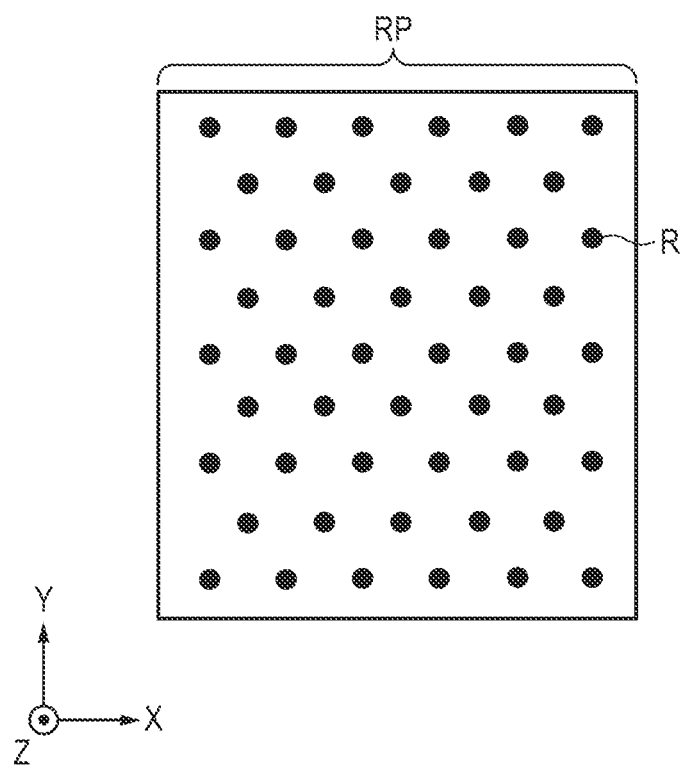
FIG. 2 is a schematic view of an imprint material supply pattern.
Figure 3:
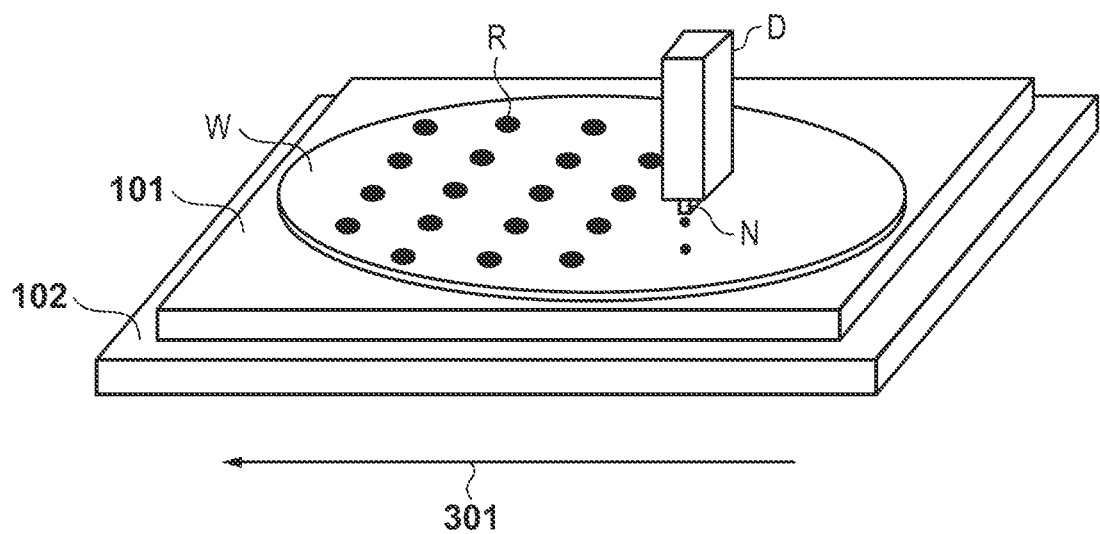
FIG. 3 is a view for explaining an imprint material supplying operation.

FIG. 2 is a schematic view of the supply pattern RP of the imprint material. Coordinate values which are used for supplying the imprint material to the substrate W are described in the supply pattern RP. The controller CNT controls the substrate stage 102 and the dispenser D so that the imprint material R will be supplied to each position on the substrate W that has been described in the supply pattern. More specifically, as shown in FIG. 3, the controller CNT will cause the imprint material R to be discharged from a plurality of nozzles N provided in the dispenser D in accordance with the supply pattern RP while moving the substrate stage 102 in the direction of an arrow 301. The unit of the imprint material supply amount from each nozzle of the dispenser D is "droplet", and one droplet of the imprint material has a volume of about several picoliters.

The controller CNT controls at least one of the mold driver 104 and the substrate stage 102 to bring the mold M and the imprint material on the substrate W into contact with each other. As a result, the pattern P of the mold M is filled with the imprint material R.

A concave portion larger than the region of the pattern P is formed in a surface on the opposite side of the surface of the pattern P at the center of the mold holder 103, and this concave portion is sealed by the mold M and a sealing glass (not shown). A pressure controller (not shown) is connected to this sealed space (cavity portion), and the pressure in the cavity portion can be controlled. When the mold M and the imprint material on the substrate W are to be brought into contact with each other, it is possible to suppress air bubbles from becoming sandwiched between the substrate W and the mold M by deforming the mold M into a convex shape by increasing the pressure in the cavity portion. When the substrate W and the mold M have been brought into contact with each other, the pressure in the cavity portion is restored to the original pressure so that the substrate W and the mold M will be completely in contact with each other.

The imprint apparatus IMP further includes alignment scopes (image capturing units) 105 which are fixed to the mold driver 104. The alignment scopes 105 detect substrate-side marks 106 formed on a shot region on the substrate W and mold-side marks 107 formed on the pattern P of the mold M. An arithmetic processing unit CAL of the controller CNT obtains the relative position deviation between the mold M and the substrate W based on the detection result of the substrate-side marks 106 and the mold-side marks 107 detected by the alignment scopes 105. Based on the obtained relative position deviation result, the controller CNT drives at least one of the substrate stage 102 and the mold driver 104 to correct the relative position deviation between the mold M and the substrate W. The relative position deviation is not limited to a shift component and can include errors in magnification and a rotation component. The shape of the pattern P (pattern region) of the mold M can be corrected in accordance with the shot region formed on the substrate W. As the detection method of the substrate-side marks 106 and the mold-side marks 107, an interference signal such as a moiré signal reflecting the relative positions of the two marks can be used. The relative positions of the two marks may also be obtained by detecting the images of the respective marks.

Reference numeral 110 denotes a mirror, reference numeral 108 denotes a light source that emits ultraviolet light, and reference numeral 109 denotes a detection light source that emits detection light. The mirror 110 is, for example, a dichroic mirror and has a property of reflecting ultraviolet light and transmitting detection light. The controller CNT cures the imprint material R by causing the light source 108 to irradiate the imprint material R with ultraviolet light for a predetermined period in a state in which the mold M and the imprint material on the substrate W are in contact with each other. Subsequently, the controller CNT controls at least one of the mold driver 104 and the substrate stage 102 to separate the mold M from the cured imprint material. As a result, an imprint material pattern is formed on the substrate W.

The detection light from the detection light source 109 is transmitted through the mirror 110, the mold driver 104, and the mold holder 103 to illuminate a shot region on the substrate W. The light that illuminated the shot region is reflected by the surface of the substrate W and the pattern surface of the mold M, and a detection unit 111 detects the reflected light beam from the substrate W and the reflected light beam from the mold M as the detection light beams. The detection light beams detected by the detection unit 111 can be displayed by the display device 112 so that an operator can observe the state of the imprint process.

Figure 4:
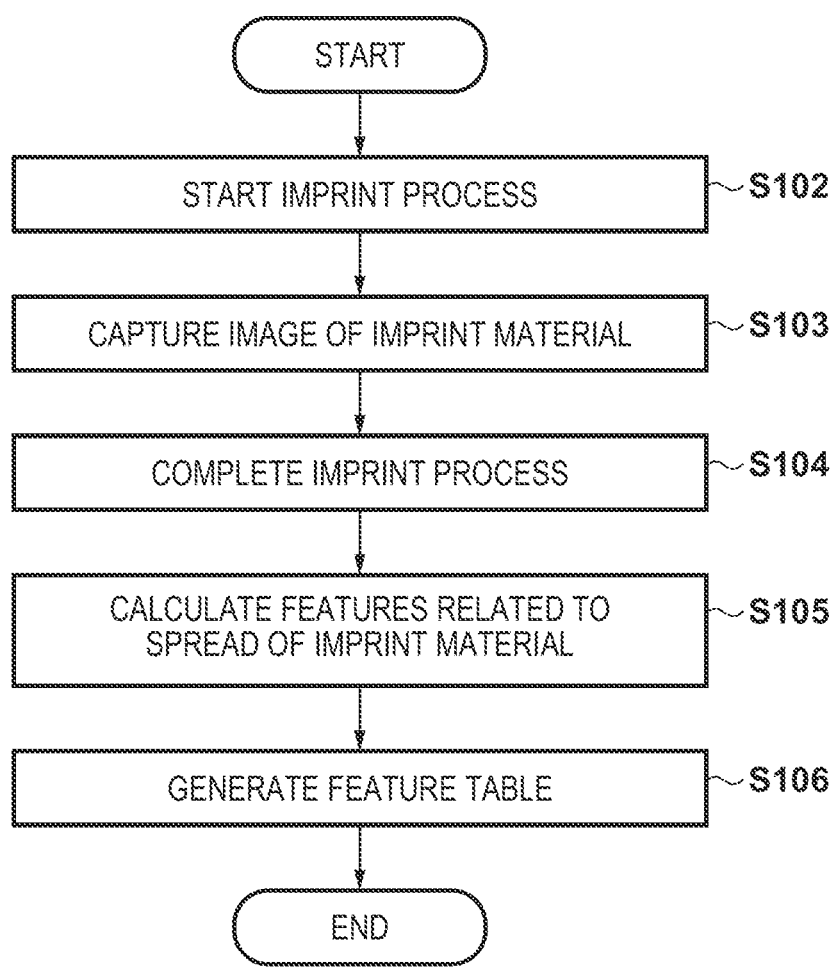
FIG. 4 is a flowchart of processing to obtain features related to the spread of an imprint material.

FIG. 4 is a flowchart of processing executed by the controller CNT to obtain a feature related to the spread of imprint material droplets. It is assumed that this processing will be executed as a job or a command when an imprint condition is to be adjusted. A case in which the pattern of the mold M extends in a single direction is also assumed here.

Figure 5A:
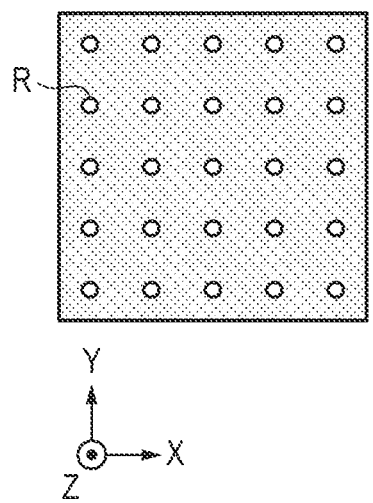
FIGS. 5A to 5F are views showing how the imprint material that is in contact with a mold spreads.
Figure 5B:
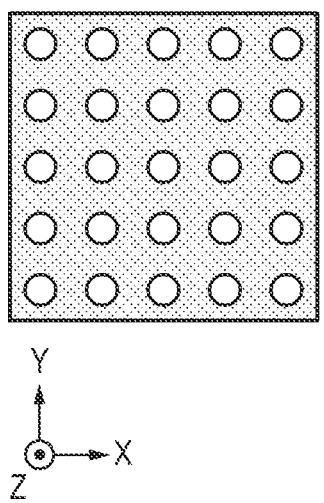
Figure 5C:
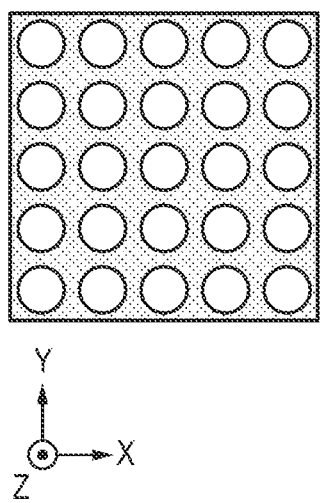
Figure 5D:
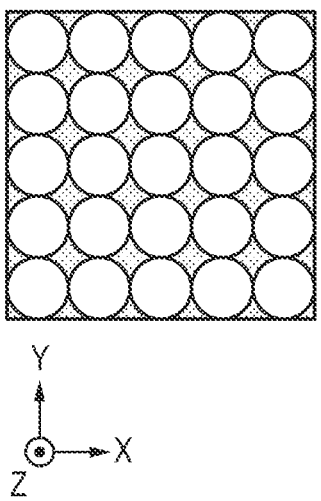
Figure 5E:
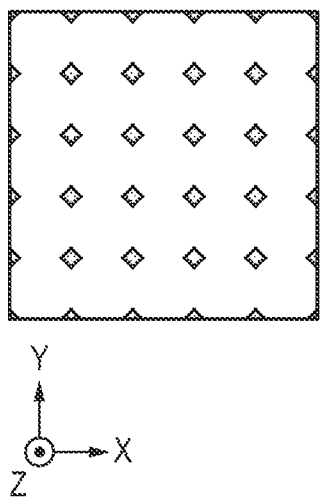
Figure 5F:
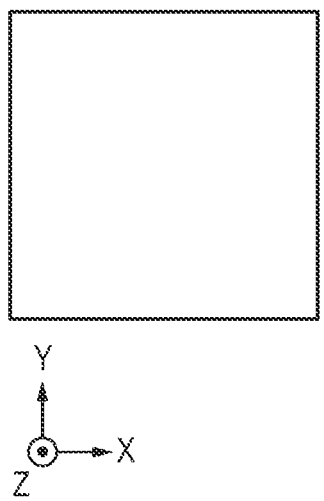

In step S102, the controller CNT starts an imprint process and brings the mold M and the imprint material on one shot region of the substrate W into contact with each other. The imprint material R is pressed into the mold M by this contact, and the imprint material R starts to spread. FIGS. 5A to 5F show how the imprint material R spreads after the mold M is brought into contact with the imprint material R. FIG. 5A shows the state immediately after the imprint material R has been supplied onto the substrate W, and it is in a state in which the droplets of the imprint material R are separated from each other. Subsequently, as the imprint material filling operation proceeds, the imprint material gradually spreads in the manner shown in FIGS. 5B and 5C and spreads until the adjacent imprint material droplets are in contact with other as shown in FIG. 5D. Furthermore, the gaps between the droplets of the imprint material become smaller as shown in FIG. 5E, becoming ultimately a state in which the imprint material has spread, without gaps, throughout the pattern region of the mold M as shown in FIG. 5F.

In step S103, each alignment scope 105 captures an image of the imprint material R to obtain the shape of the spread of the droplets of the imprint material R. A high-magnification image capturing system is required to capture the shape of the spread of the droplets of the imprint material R, and thus the alignment scopes 105 are used in this embodiment. However, note that another image capturing system may be used as long as the image capturing of the imprint material can be performed, and for example, the detection unit 111 may be used. It is preferable for the image obtained in step S103 to be a continuous image obtained during a predetermined time interval from the start of the spread of the imprint material R to the end. This is because the shape of the spread of each droplet of the imprint material R cannot be determined in a state in which the filling operation has been completed as with that shown in FIG. 5F. Hence, the shape of the spread of the imprint material when the filling time has elapsed can be estimated by capturing images of the process in which the imprint material spreads. In addition, as an imprint process for confirmation, image capturing can be performed by arranging the imprint material by increasing the interval between the droplets so that the droplets of the imprint material R will not come into contact with each other, in the manner shown in FIG. 5C, even after the predetermined filling time has elapsed.

Figure 6:
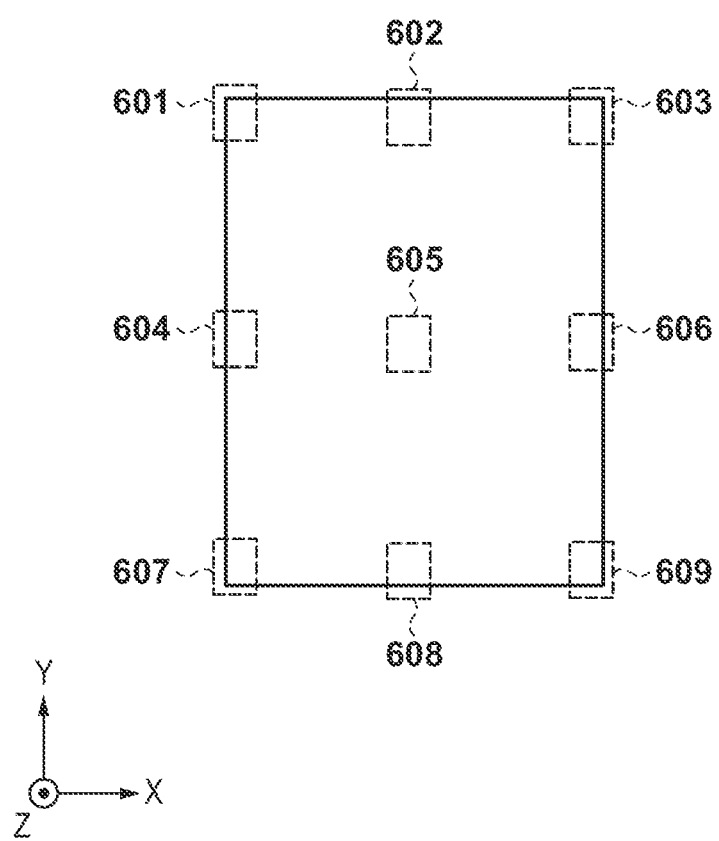
FIG. 6 is a view showing an example of image capturing regions of the imprint material.

The image capturing field of view of a high-magnification image capturing system such as each alignment scope 105 is narrower than the pattern region of the mold M. The shape of the spread of the droplet of the imprint material R will vary depending on the location where the imprint material R is arranged. Hence, the image capturing operation of the imprint material R needs to be performed at a plurality of locations in the shot region. FIG. 6 shows an example of a plurality of image capturing regions for performing image capturing of the imprint material in the shot region in step S103. When the mold M is to be brought into contact with the imprint material, the mold M is changed into a convex shape by executing pressure control in the sealed space (cavity portion) sealed by the mold M and the sealing glass (not shown) as described above in FIG. 1. Hence, the time at which the mold M comes into contact with the imprint material R varies depending on the distance from the center of the shot region. A plurality of regions where the contact time of the imprint material and the mold M can differ in this manner are selected as the image capturing regions of the imprint material R in step S103. In the example shown in FIG. 6, the plurality of image capturing regions include a region 605 including the center of the shot region, regions 601, 603, 607, and 609 at the respective four corners of the shot region, and regions 602, 604, 606, and 608 at middle positions of the respective sides of the shot region. However, note that the image capturing regions may be arranged in locations other than these.

In step S104, when the filling has been completed during the process of step S103, the controller CNT causes the light source 108 to irradiate the imprint material with ultraviolet light to cure the imprint material R. Subsequently, the controller CNT controls at least one of the mold driver 104 and the substrate stage 102 to separate the mold M from the cured imprint material. In this manner, the imprint process on the shot region ends in step S104.

Subsequently, in step S105, the controller CNT calculates the features of the spread of the imprint material R by using the image obtained in step S102. The feature calculation method related to the spread of the imprint material R performed in step S105 will be described with reference to FIGS. 7A to 7F.

Figure 7A:
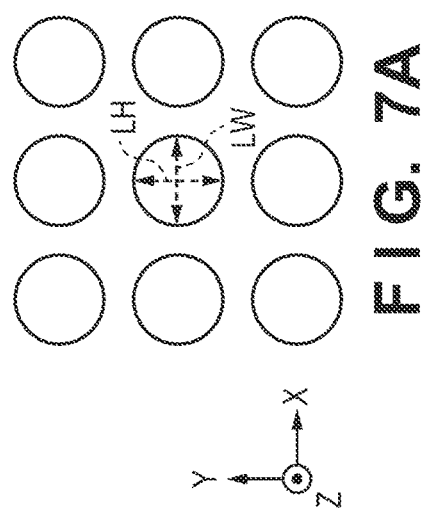
FIGS. 7A to 7F are views for explaining a feature calculation method related to the spread of the imprint material.

Features can include, for example, the diameter of a circle when one droplet, of a plurality of droplets, is approximated by a circle based on the image of the droplet. FIG. 7A shows the features of each droplet of the imprint material R that has spread concentrically. In this case, the features of the imprint material R include a horizontal direction (X-direction) length LW and a vertical direction (Y-direction) length LH of the imprint material R. These features are calculated by image processing by counting the number of pixels occupied by the imprint material R.

Figure 7B:
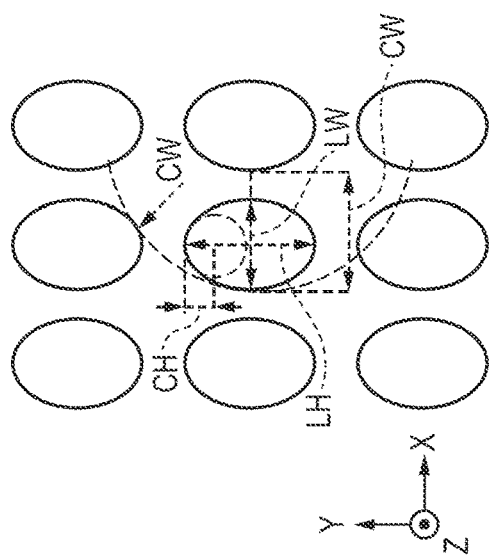
Figure 7C:
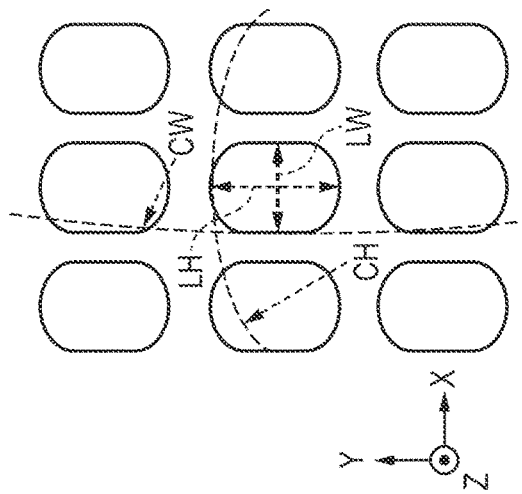

Alternatively, the features can include a major axis length, a minor axis length, a radius of curvature, and a tilt of an ellipse when one droplet, of a plurality of droplets, is approximated by an ellipse based on the image of the droplet. FIGS. 7B and 7C each show the features of each droplet of the imprint material R spreading larger in the vertical direction (Y direction) than in the horizontal direction (X direction) (that is, spreading in an elliptical shape). In this case, the features of the imprint material R include the horizontal direction length LW and the vertical direction length LH of the imprint material R. In addition, as shown in FIGS. 7B and 7C, even if the extending directions of the droplets of the imprint material R are the same and the shape of the spread of each droplet is an elliptical shape, the shape of the ellipse will differ depending on the fineness of the pattern of the mold M. Hence, the features of the imprint material R further include a radius CH of curvature of the ellipse in the vertical direction and a radius CW of curvature of the ellipse in the width direction. In FIGS. 7B and 7C, even if both drawings show imprint material droplets that have spread largely in the vertical direction, each imprint material droplet of FIG. 7B has a shape closer to an ellipse and each imprint material droplet of FIG. 7C have a shape closer to the shape of a race track. The radius CH of curvature and the radius CW of curvature represent this kind of difference. The radius CH of curvature and the radius CW of curvature are also calculated by image processing as the radius of a circumscribed circle and the radius of an inscribed circle in the vertical direction of a pixel occupied by the imprint material R.

Figure 7D:
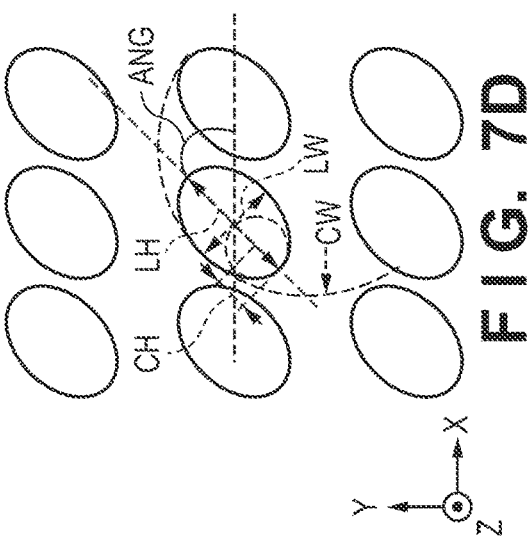

FIG. 7D shows the features of each droplet of the imprint material R spreading largely in a diagonal direction with respect to the X direction and the Y direction. The features of the imprint material R in this case include, by setting the maximum spread direction as the major axis length direction, a length H of the major axis length and the length LW of the minor axis length. The features of the imprint material R in this case also include an angle ANG with respect to the X-axis in the major axis length direction, the radius CH of curvature of the ellipse in the major axis length direction, and the radius CW of curvature of the ellipse in the minor axis length direction. Note that the angle ANG can be calculated by image processing such as the Hough transform or the like.

Figure 7E:
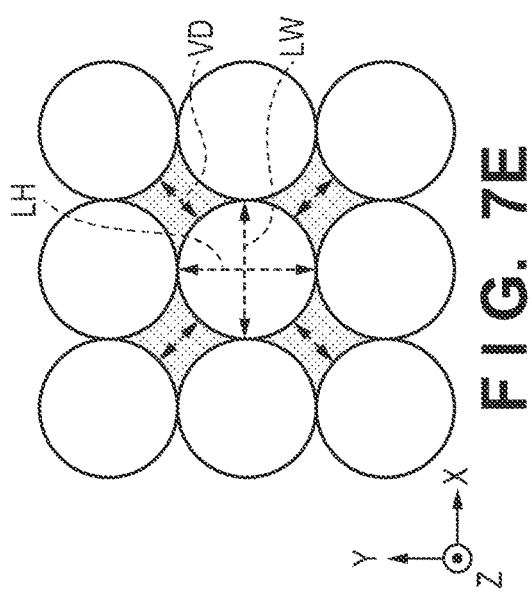
Figure 7F:
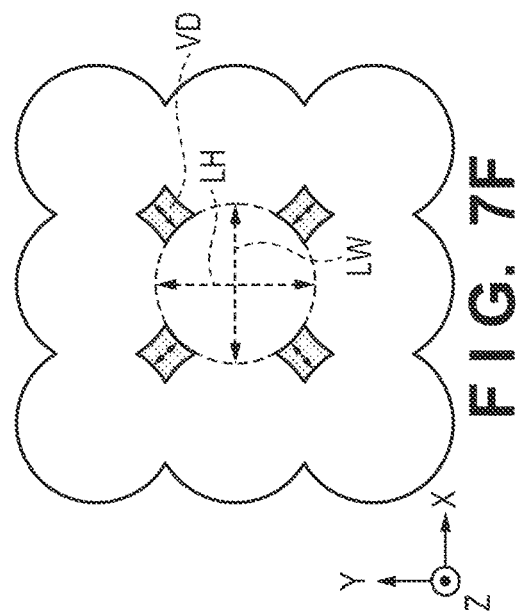

FIGS. 7E and 7F each show the features of each droplet of the imprint material when an imprint material droplet is in contact with an adjacent imprint material droplet. In this case, the features of the imprint material R include a value obtained by subtracting a distance VD of an unfilled region, which is formed between the imprint material droplet and the adjacent imprint material droplet, from the design value of a distance to the adjacent imprint material droplet. Since each droplet of the imprint material R has a circular shape in the case of FIGS. 7E and 7F, the features include the horizontal direction length LW and the vertical direction length LH of the imprint material R.

In step S106, the controller CNT generates a feature table in which the features calculated in step S105 have been described, and stores the feature table in the memory 2. FIG. 8 shows an example of the feature table. The feature table includes data of correspondence relationships obtained in advance between imprint conditions and features related to the spread of each imprint material droplet when the mold and the imprint material are brought in contact with each other under the imprint conditions. In addition, the feature table includes data of such correspondence relationships for the plurality of imprint conditions. Each imprint condition and the features of the shape of the spread of the imprint material R calculated under this imprint condition are stored in the feature table. The imprint conditions can include at least one of the following conditions.

"Mold Type" represents the type of the pattern used as the mold M and can include, for example, "Plane" which indicates a state without a pattern, "Line&Space" which indicates a state in which a rectangular pattern is arranged. "Line&Space" is a state in which a rectangular pattern is arranged in a diagonal direction may be described as "tilted". Other than these, a state in which a circular pattern is arranged may be included.

"Filling Time" represents the time set to fill the pattern of the mold M with the imprint material by bringing the imprint material and the mold M into contact with each other. The spread of the imprint material will become larger when the filling time is longer than when the filling time is short.

"Imprint Control Mode" represents a control mode related to the relative speed of travel of the imprint material and the mold M when the mold M is brought into contact with the imprint material. The spread of the imprint material is faster in a "Fast Mode" since the "Fast mode" will bring the mold into contact with the imprint material at a faster speed than a "Standard Mode". Note that a parameter designating imprint control may be described instead of the imprint control mode.

Figure 9:
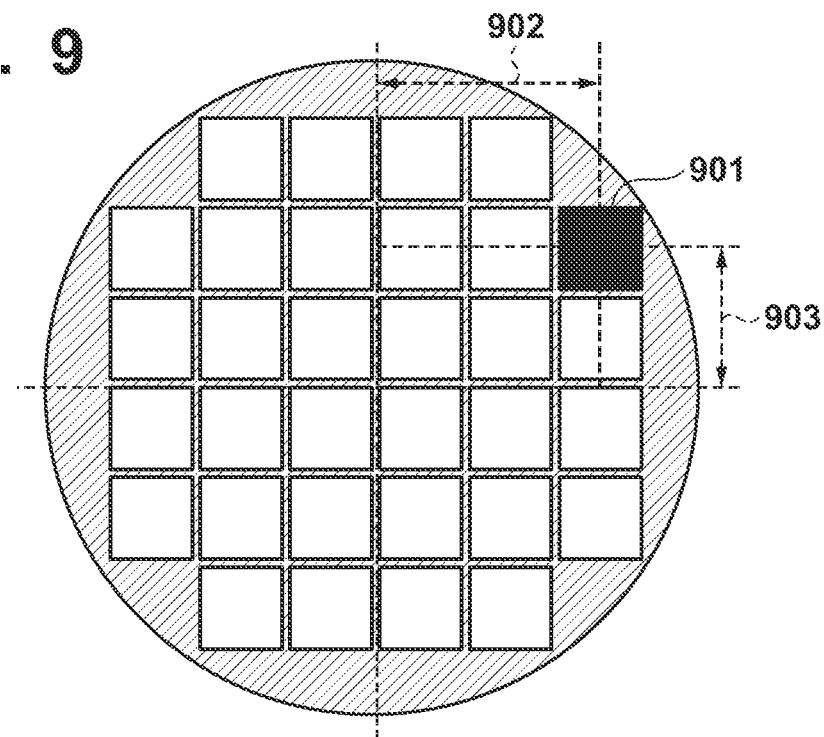
FIG. 9 is a view for explaining a measurement position in a substrate coordinate system.

"Measurement Position (Shot Coordinate System)" indicates, for example, the coordinate values with respect to the center of a shot region at a measurement position as shown in FIG. 6. "Measurement Position (Substrate Coordinate System)" indicates the coordinate values with respect to the center of the substrate at the center of the shot region. For example, as shown in FIG. 9, as an X-direction distance 902 and a Y-direction distance 903 between the center of the substrate and the center of a shot region 901 are obtained as the coordinate values with respect to the center of the substrate at the center of the shot region 901.

"Material of Imprint Material" specifies the material of the imprint material R. The spread of the imprint material R can vary depending on the material of the imprint material even if identical imprint control is performed.

"Material of Substrate Coating Material" specifies the material of the coating material on the surface of the substrate W. Even if the same filling time is set, the imprint material R will spread faster when the compatibility between the imprint material R and the substrate coating material is higher.

"Flow Rate of Atmospheric Fluid" indicates the flow rate of a gas filling the atmosphere of the imprint material R. In a case in which the imprint material R is a photo-curable resin, for example, helium will fill the atmosphere of the imprint material R to promote the curing. Since the direction and the amount of the flow of the helium have an influence on the volatility of the imprint material, the spread of the imprint material can be changed. "Flow Rate of Atmospheric Fluid" can also include the direction in which the atmospheric gas flows.

"Features of Shape of Spread" include LW, LH, CW, CH, and ANG calculated above in step S104. As described above, a plurality of combinations No. A to H of the imprint conditions used to measure the features and the features related to the spread of the imprint material R can be described in the feature table of FIG. 8. Note that the imprint conditions and the features related to the spread of the imprint material described above are merely examples, and an imprint condition or a feature other than these may be included. As described above, the processing performed to obtain the features related to the spread of the imprint material is completed.

Figure 10:
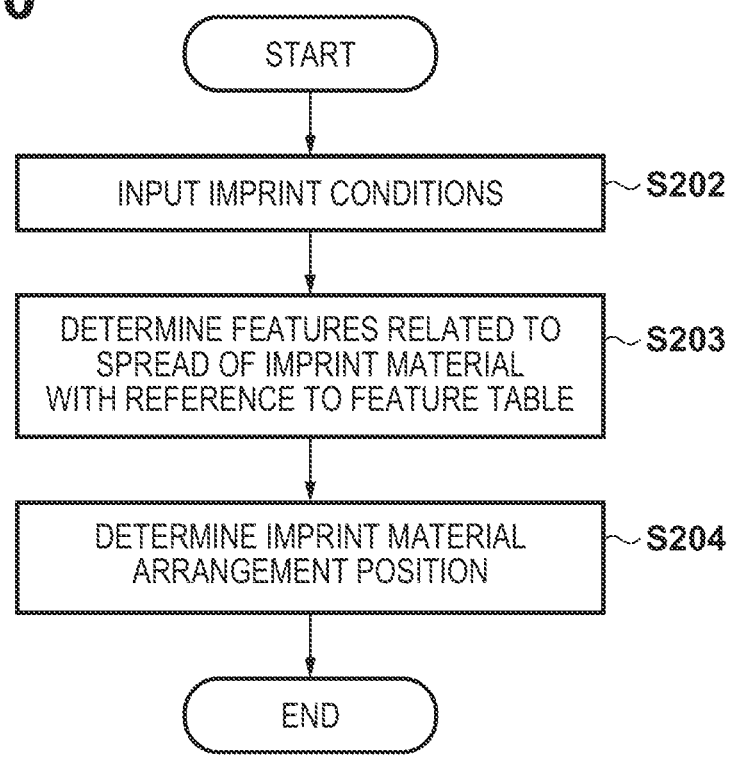
FIG. 10 is a flowchart of supply pattern generation processing.

FIG. 10 is a flowchart of supply pattern generation processing. In step S202, imprint conditions are input by an operation by a user. The user can designate the imprint conditions by using, for example, the input device 113. The imprint conditions can include, as shown in FIG. 8, the mold type, the filling time, the imprint control mode, the material of the imprint material, the material of the coating material on the surface of the substrate W, and the flow rate of the fluid in the atmosphere of the imprint material. The imprint conditions can further include the supply pattern position in the shot coordinate system and the supply pattern position in the substrate coordinate system. The supply pattern position in the shot coordinate system and the supply pattern position in the substrate coordinate system need not be directly designated by the user. For example, a target shot region may be automatically divided into smaller regions by designating a shot region for supply pattern determination, and the position of each divided region may be used as the input information.

In step S203, the controller CNT determines the features related to the spread of the imprint material R that match the imprint conditions by comparing the imprint conditions input in step S202 and the imprint conditions in the feature table stored in the memory 2. The controller CNT will collate here the supply pattern position in the shot coordinate system and the supply pattern position in the substrate coordinate system input in step S202 with the measurement positions in the shot coordinate system and the measurement positions in the substrate coordinate system stored in the feature table.

In step S203, if an imprint condition that matches the input imprint condition is not present in the feature table, a feature related to the spread of the imprint material R of the input imprint condition may be newly determined. For example, consider a case in which the filling time is set to two sec in the input imprint conditions when the feature table includes only one sec and three sec as conditions for the filling time. In this case, an average value of the features related to the spread of the imprint material obtained when the filling time is one sec and those obtained when the filling time is three sec can be determined as the features obtained when the filling time is two sec.

Figure 11A:
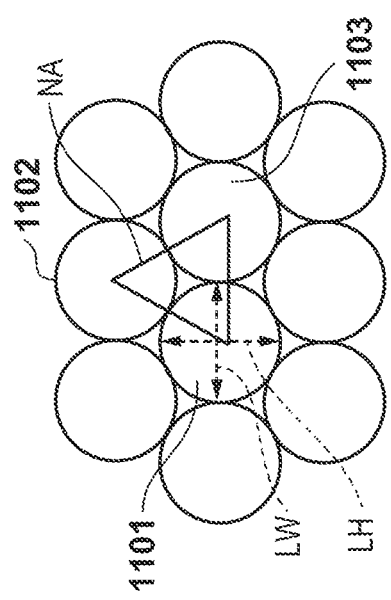
FIGS. 11A to 11D are views for explaining an imprint material arrangement position determination method.

In step S204, the controller CNT determines the imprint material arrangement position based on the features related to the spread of the imprint material determined in step S203. For example, as shown in FIG. 11A, a circle 1101 formed by the horizontal direction length LW and the vertical direction length LH which are the features of the shape of the spread is generated. Subsequently, the shape of the spread of the imprint material is estimated in a region adjacent to the shape of the spread of the imprint material generated in advance. In FIG. 11A, a circle 1102 and a circle 1103, each of which is an estimated spread shape adjacent to the estimated spread shape of the circle 1101, are calculated. Subsequently, the estimated spread shape positions are finely adjusted so that the adjacent estimated spread shape positions will be in tight contact with each other. The positions of the circles 1102 and 1103 are finely adjusted here to be at positions where the area of a polygon region NA, obtained by connecting the centers of gravity of the plurality of adjacent estimated spread shapes, will be minimized. As this fine adjustment method, a method of moving the center position of a spread region in a predetermined region and determining a location where the area of the region NA can be minimized in this range can be considered. However, the fine adjustment method is not limited to this.

In this manner, the controller CNT repeatedly performs an operation to determine the shape of the spread based on the feature table and an operation to finely adjust each estimated spread shape position in one shot region. Subsequently, the controller CNT determines the center position of the each estimated spread shape finally obtained in the shot region as the imprint material arrangement position.

Figure 11B:
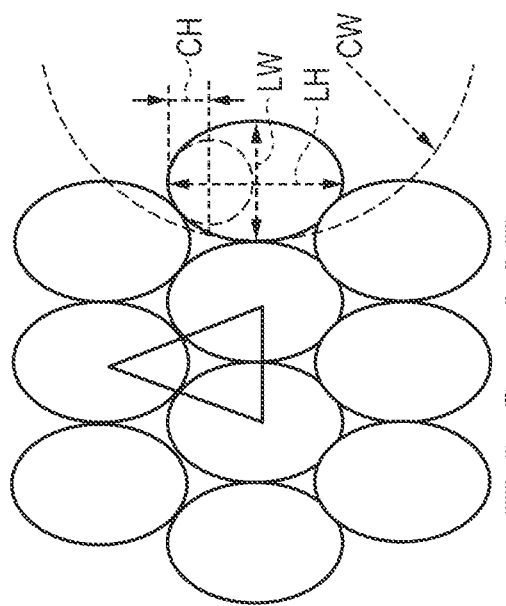
Figure 11C:
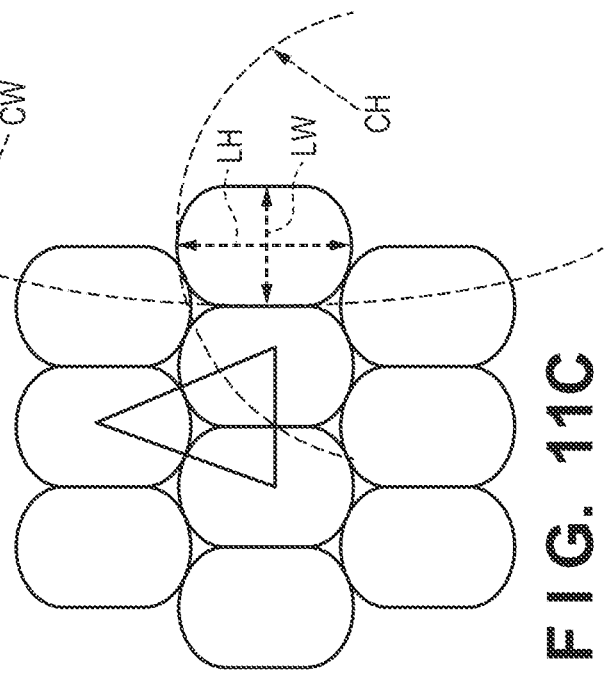
Figure 11D:
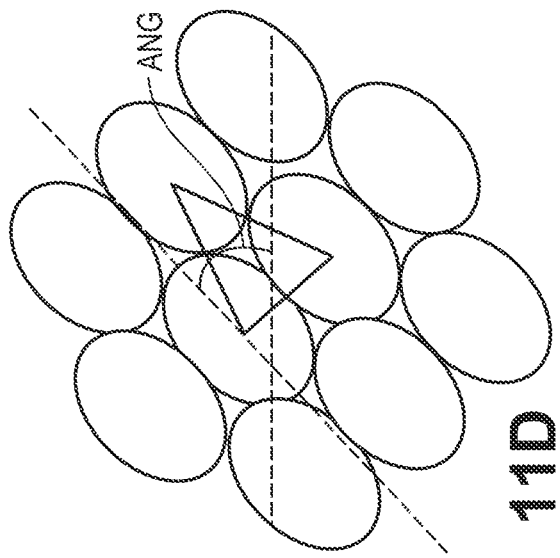

FIGS. 11B and 11C each show a case in which the estimated spread shape is an ellipse. The estimated spread shape is determined based on the horizontal direction length LW, the vertical direction length LH, the radius CW of curvature of the ellipse in the horizontal direction, and the radius CH of curvature in the vertical direction of the ellipse of the imprint material R. In addition, FIG. 11D shows a case in which the estimated spread shape is an ellipse with a tilt of the angle ANG. In this manner, for each imprint material arrangement position, the controller CNT determines the estimated spread shape from the feature data and adjusts the position of each estimated spread shape so as to minimize the area of the polygon region NA obtained by connecting the centers of gravity of the plurality of estimated spread shapes which are adjacent to each other. The controller CNT will determine the imprint material arrangement positions by repeatedly performing this adjustment operation on each spread shape.

The controller CNT generates the supply pattern RP based on the determined imprint material arrangement positions. The supply pattern RP is stored in a format that can be used by an apparatus. For example, the supply pattern RP is stored in a predetermined file format in the storage unit of the console unit CONS or the memory 2 of the controller CNT.

Note that although it was described in the above example that the supply pattern determination processing is to be executed by the controller CNT, the processing may be executed by the console unit CONS. Alternatively, the supply pattern determination processing may be executed in an external information processing apparatus (arithmetic processing apparatus) other than the imprint apparatus.

FIG. 12 shows a case in which the feature data differs depending on the position of the droplet of the imprint material R. Each imprint material droplet on the left of the shot region has a wider spread shape than each imprint material droplet on the right of the shot region. The features of the shape of the spread of each imprint material droplet of FIG. 12 will be determined in the same manner as FIG. 11 based on the feature table in accordance with the imprint conditions and the position. The estimated spread shape of the imprint material will be determined based on the determined features. In addition, the arrangement position of each spread shape is finely adjusted so as to minimize the area of the polygon region NA obtained by connecting the centers of gravity of the plurality of estimated spread shapes which are adjacent to each other.

In FIG. 12, a plurality of different estimated spread shapes are present in the shot region so that the estimated spread shapes on the left of the shot region are wide and the estimated spread shapes on the right of the shot region are small. In such a case, it will not become the supply pattern RP in which the imprint material droplets are arranged without overlapping each other as in the manner shown in FIGS. 11A to 11D. Hence, in FIG. 12, a fine adjustment operation is performed so as to minimize the size of the polygon region NA, obtained by connecting the centers of gravity of the plurality of estimated spread shapes which are adjacent to each other, while permitting a predetermined degree of overlap between estimated spread shapes as shown in a region 1201. Also, the density of the supply pattern may be adjusted by adjusting the permissible overlap width between these estimated spread shapes. For example, the permissible overlap width can be increased to allow as many estimated spread shapes to be arranged in a predetermined region as possible. In contrast to this permissible overlap amount, it is also possible to generate a gap width between the estimated spread shapes to allow as few estimated spread shapes to be arranged in the predetermined region as possible. The density adjustment of the estimated spread shapes to be arranged in this predetermined region can be used to adjust the residual layer thickness of the imprint material R formed by the generated supply pattern. In this manner, the controller CNT can determine the supply pattern based on the result of an adjustment performed so as to minimize, under a predetermined overlap restriction, the area of a polygon obtained by connecting the centers of gravity of the plurality of estimated spread shapes which are adjacent to each other.

According to this embodiment, a suitable supply pattern can be determined based on an image showing the spread of the imprint material which is captured at the actual execution of an imprint process. As a result, it is possible to generate the supply pattern RP with consideration to the spread of each droplet of the imprint material R at the time of the actual imprint process. The supply pattern RP generated by this method will be a supply pattern with better performance, such as fewer defects, than a supply pattern generated by the method of the related art that does not consider the spread of each droplet of imprint material R, thereby leading to an improvement in yield at the time of the imprint process. In addition, using this method will lead to a reduction in adjustment operation time at the generation of the supply pattern RP.

Second Embodiment

FIG. 13A shows an example of the pattern shapes of the mold M used in the second embodiment. The first embodiment described above assumed that the mold M has a uniform pattern on its entire surface. The mold M according to this embodiment has a different pattern of the mold M for each region as shown in FIG. 13A. FIG. 13B shows a state in which FIG. 13A has been categorized by types of patterns. In FIG. 13B, reference numerals 1301 and 1305 each indicate a region arranged with a horizontal direction (X direction) pattern, reference numerals 1302 and 1304 each indicate a region without a pattern, and reference numeral 1303 is a region arranged with a vertical direction (Y direction) pattern. Note that the patterns shown in FIG. 13A are merely examples, and the present invention is not limited to the examples shown in FIG. 13A as long as the mold M is formed from different patterns.

Figure 14:
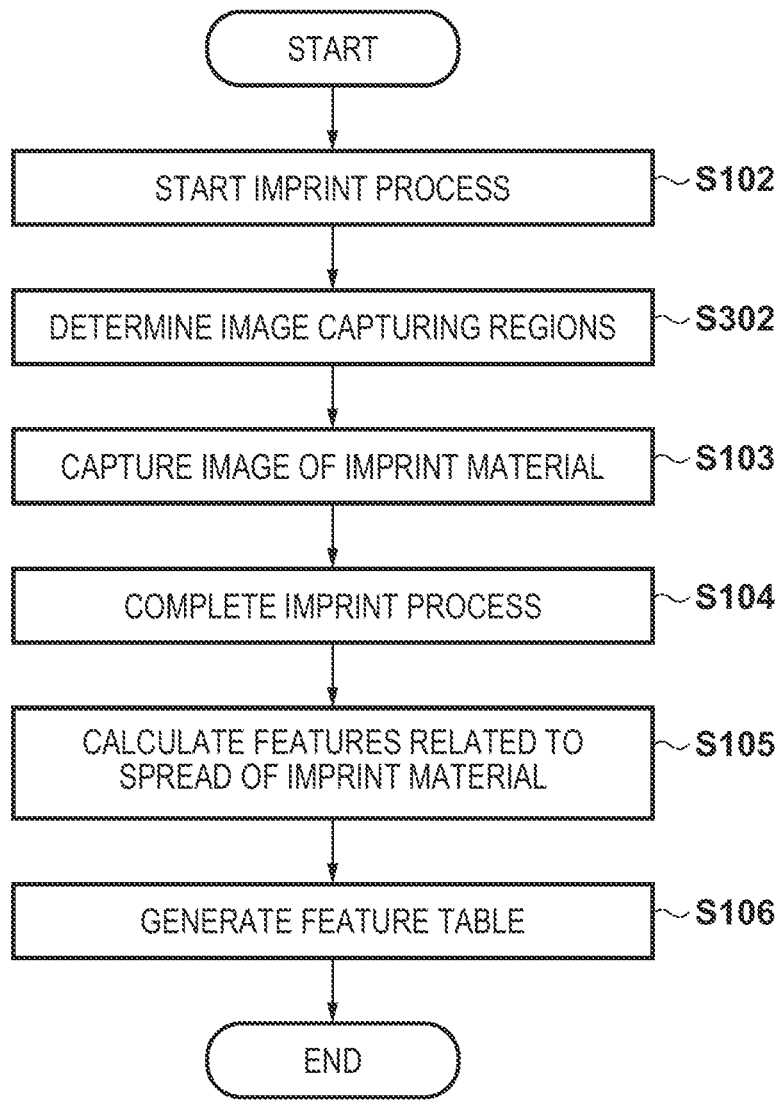
FIG. 14 is a flowchart of processing to obtain features related to the spread of an imprint material.

FIG. 14 is a flowchart of processing to obtain features related to the spread of the imprint material according to this embodiment. The same reference numerals denote processes with the same contents as compared to those of the flowchart of FIG. 4 according to the first embodiment, and a description thereof will be omitted. Compared to the flowchart of FIG. 4, the flowchart of FIG. 14 includes step S302 before step S103. In step S302, a controller CNT determines the image capturing regions of the imprint material. Since the pattern of the mold was uniform on the entire surface of the mold M in the first embodiment, the center of the shot region, the vertices, and the middle positions of the respective sides were set as the image capturing regions as shown in FIG. 6. However, in a case in which the mold M includes a plurality of different patterns as shown in FIG. 13A, the shape of the spread of an imprint material R will vary due to the influence of the pattern. Hence, the image capturing regions need to be increased in accordance with the contents of the patterns. Therefore, the controller CNT will determine the image capturing region in accordance with each pattern formed on the mold M.

Figure 15:
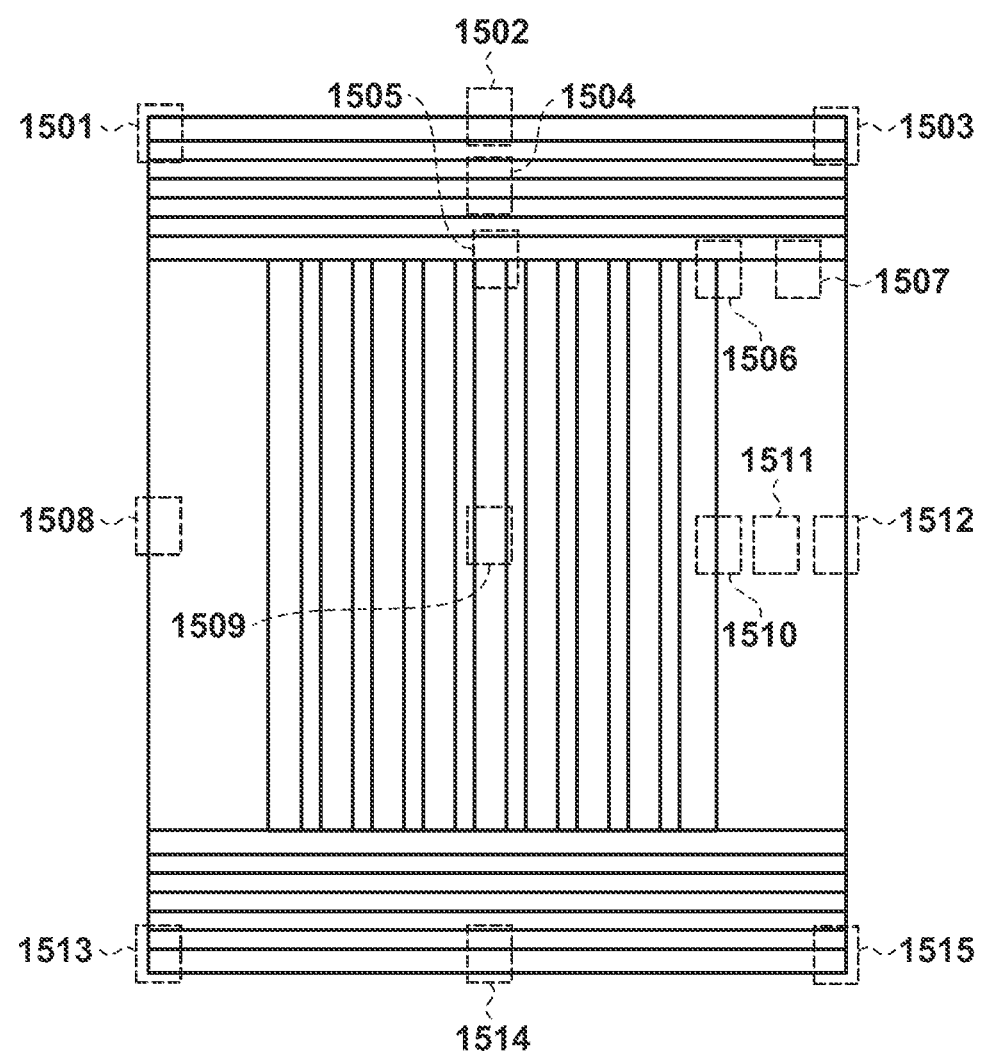
FIG. 15 is a view showing an example of image capturing regions of an imprint material.

FIG. 15 shows an example of the image capturing regions of the mold M. Image capturing regions 1501, 1502, 1503, 1508, 1509, 1512, 1513, 1514, and 1515 are image capturing regions determined based on the differences from the center of the shot region in the same manner as the example shown in FIG. 6. In addition to these, the following image capturing regions are added in this embodiment. Each of reference numerals 1504, 1509, and 1511 is an image capturing region placed at the center of a region for each pattern and is used for capturing the difference of each pattern. Reference numerals 1505, 1506, 1507, and 1510 are image capturing regions at boundary portions between regions that have different patterns.

In this manner, in step S302, when the mold M is formed from several different patterns, the image capturing region corresponding to the pattern is determined so that a spread shape according to difference in the pattern can be captured. Note that the image capturing regions shown in FIG. 15 are merely examples, and the image capturing regions may be further increased to increase the accuracy of the spread shape to be captured.

In step S103, each alignment scope 105 captures an image of the imprint material in each image capturing region determined in step S302. The feature calculation method related to the spread of the imprint material R performed in step S105 will be described with reference to FIGS. 16A to 16C.

Figure 16A:
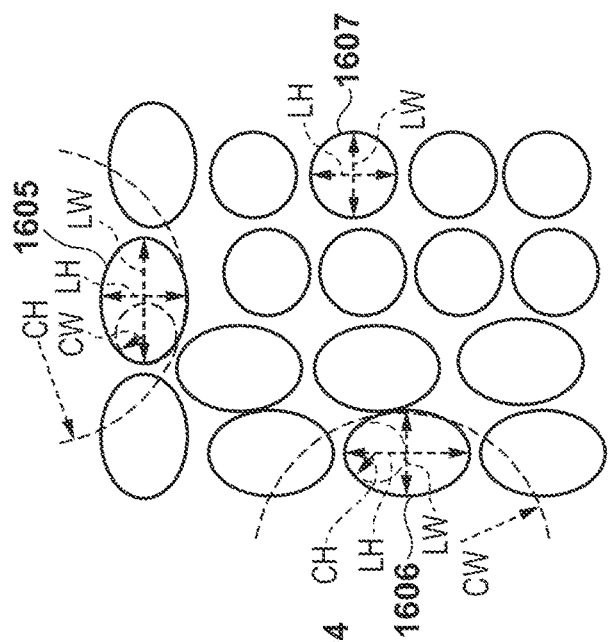
FIGS. 16A to 16C are views for explaining a feature calculation method related to the spread of the imprint material.

FIG. 16A shows the features of an image captured in the image capturing region 1505. In the image capturing region 1505, the upper portion is a region where the horizontal pattern is arranged and the lower portion is a region where the vertical pattern is arranged. The shape of each droplet of the imprint material shown in FIG. 16A differs depending on the pattern where the droplet of the imprint material R is positioned. For example, the imprint material positioned in a horizontal direction pattern region 1601 has an elliptical shape extending in the horizontal direction. On the other hand, the imprint material positioned in a vertical direction pattern region 1602 has an elliptical shape extending in the vertical direction. Hence, the controller CNT will calculate the features of the imprint material in the region 1601 and the features of the imprint material in the 1602 separately. Since the imprint material of the region 1601 and the imprint material of the region 1602 each have an elliptical shape, a horizontal direction length LW, a vertical direction length LH, a radius CW of curvature of the ellipse in the horizontal direction, and a radius CH of curvature of the ellipse in the vertical direction are calculated as features. At this time, the features are obtained by image processing in the same manner as in the first embodiment.

Subsequently, the controller CNT calculates the features of all of the imprint material droplets included in the image capturing region 1505 and ultimately performs averaging of every feature calculated in the image capturing region 1505 to set the obtained average values as the features of the image capturing region 1505. Although an average value of each feature of the imprint material droplets included in the image capturing region is used in the feature calculation method in the image capturing region, another representative value such as the mode may be used instead of the average value.

Figure 16B:
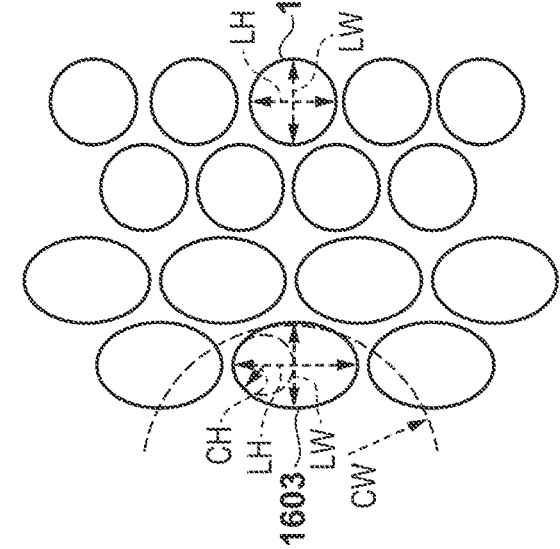

FIG. 16B shows features of an image captured in the image capturing region 1510. In the image capturing region 1510, the left side is a region arranged with the vertical direction pattern and the right side is a region without a pattern. Hence, the imprint material in a region 1603 has an elliptical shape extending in the vertical direction, and the imprint material in a region 1604 has a circular shape. Although imprint material droplets that have different shapes are also present in FIG. 16B, the horizontal direction length LW, the vertical direction length LH, the radius CW of curvature of the ellipse in the horizontal direction, and the radius CH of curvature of the ellipse in the vertical direction are obtained as the features in the same manner as that in FIG. 16A. Subsequently, averaging of every feature calculated in the image capturing region 1510 is performed, and the average values obtained from this operation are set as the features of the image capturing region 1510.

Figure 16C:
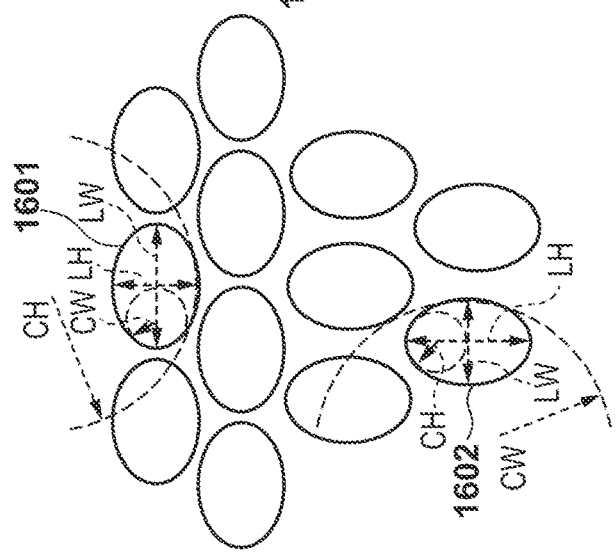

FIG. 16C shows the features of an image captured in the image capturing region 1506. In the image capturing region 1506, the upper portion is a region arranged with the horizontal direction pattern, the lower left side is a region arranged with the vertical direction pattern, and the lower right side is a region without a pattern. Hence, the imprint material droplet in a region 1605 has an elliptical shape extending in the horizontal direction, the imprint material droplet in a region 1606 has an elliptical shape extending in the vertical direction, and the imprint material droplet in a region 1607 has a circular shape. Imprint material droplets that have different sets of features are included in the image capturing region 1506. However, in the same manner as in FIGS. 16A and 16B, the horizontal direction length LW, the vertical direction length LH, the radius CW of curvature of the ellipse in the horizontal direction, and the radius CH of curvature of the ellipse in the vertical direction are obtained as the features. Subsequently, averaging of every feature calculated in the image capturing region 1506 is performed, and the average values obtained from this operation are set as the features of the image capturing region 1506.

FIG. 17 shows an example of a feature table. Compared to the feature table shown in FIG. 8, the number of mold types has increased in the feature table of FIG. 17. Mold types for a case in which only a single pattern is present as in the image capturing regions 1509, 1504, and 1511 are as follows.

No. A: Line&Space (Vertical)
No. B: Line&Space (Horizontal)
No. C: Plane

On the other hand, mold types for a case in which a plurality of patterns are present as in the image capturing regions 1505, 1510, and 1507 are as follows.

No. D: Border (Line&Space Vertical between Line&Space Horizontal)
No. E: Border (Line&Space Vertical between Plane)
No. F: Border (Line&Space Horizontal between Line&Space Vertical)

Figure 18:
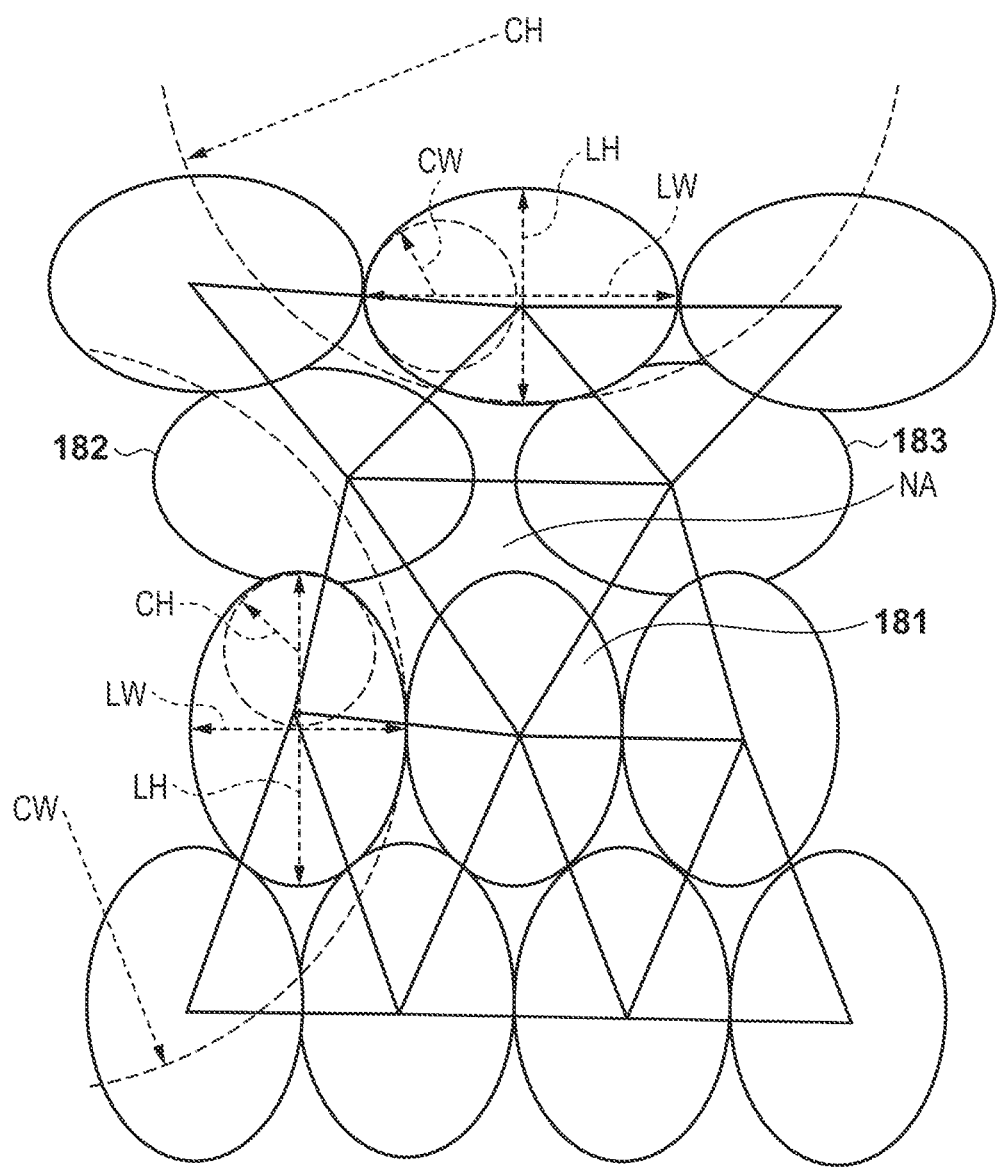
FIG. 18 is a view for explaining an imprint material arrangement position determination method.

Supply pattern generation processing can be performed in the same manner as in the first embodiment (FIG. 10). An imprint material arrangement position determination method according to this embodiment will be described with reference to FIG. 18. The features related to the spread of the imprint material corresponding to the imprint conditions are specified in step S204. The controller CNT uses these features to calculate the estimated spread shape of each droplet of the imprint material. FIG. 18 is a view for explaining the imprint material arrangement position determination method when a region arranged with a horizontal pattern is included in the upper portion and a region arranged with a vertical pattern is included in the lower portion as in the image capturing region 1505. The estimated spread shape of the imprint material in a region 181 is calculated here first. More specifically, in the same manner as the first embodiment, the estimated spread shape is calculated by using the horizontal direction length LW, the vertical direction length LH, the radius CW of curvature of the ellipse in the horizontal direction, and the radius CH of curvature of the ellipse in the vertical direction. Subsequently, the spread shape of the imprint material in each region adjacent to the generated region 181 is estimated. In FIG. 18, the spread shapes of the imprint material in the regions 182 and 183 adjacent to region 181 are calculated. Although the spread shape of the imprint material in region 181 is an elliptical shape in the vertical direction, the spread shape of the imprint material in each of the regions 182 and 183 is an elliptical shape in the horizontal direction.

Subsequently, in the same manner as in the first embodiment, the position of each estimated spread shape is finely adjusted so that the estimated spread shapes which are adjacent to each other will be in tight contact. The positions of the region 182 and the region 183 are finely adjusted here so as to minimize the area of a region NA obtained by connecting the centers of the plurality of estimated spread shapes. The imprint material positions on the entire shot region are determined by repeatedly calculating, in the shot region, each estimated spread shape calculated by using the feature table in this manner. Subsequently, an aggregate of the centers of the respective spread shapes of the imprint material is used as a supply pattern RP.

In this manner, according to this embodiment, even in a case in which the mold M is formed by a plurality of pattern regions, a suitable supply pattern can be determined based on an image indicating the spread of the imprint material which is captured at the execution of an actual imprint process.

Third Embodiment

Figure 19:
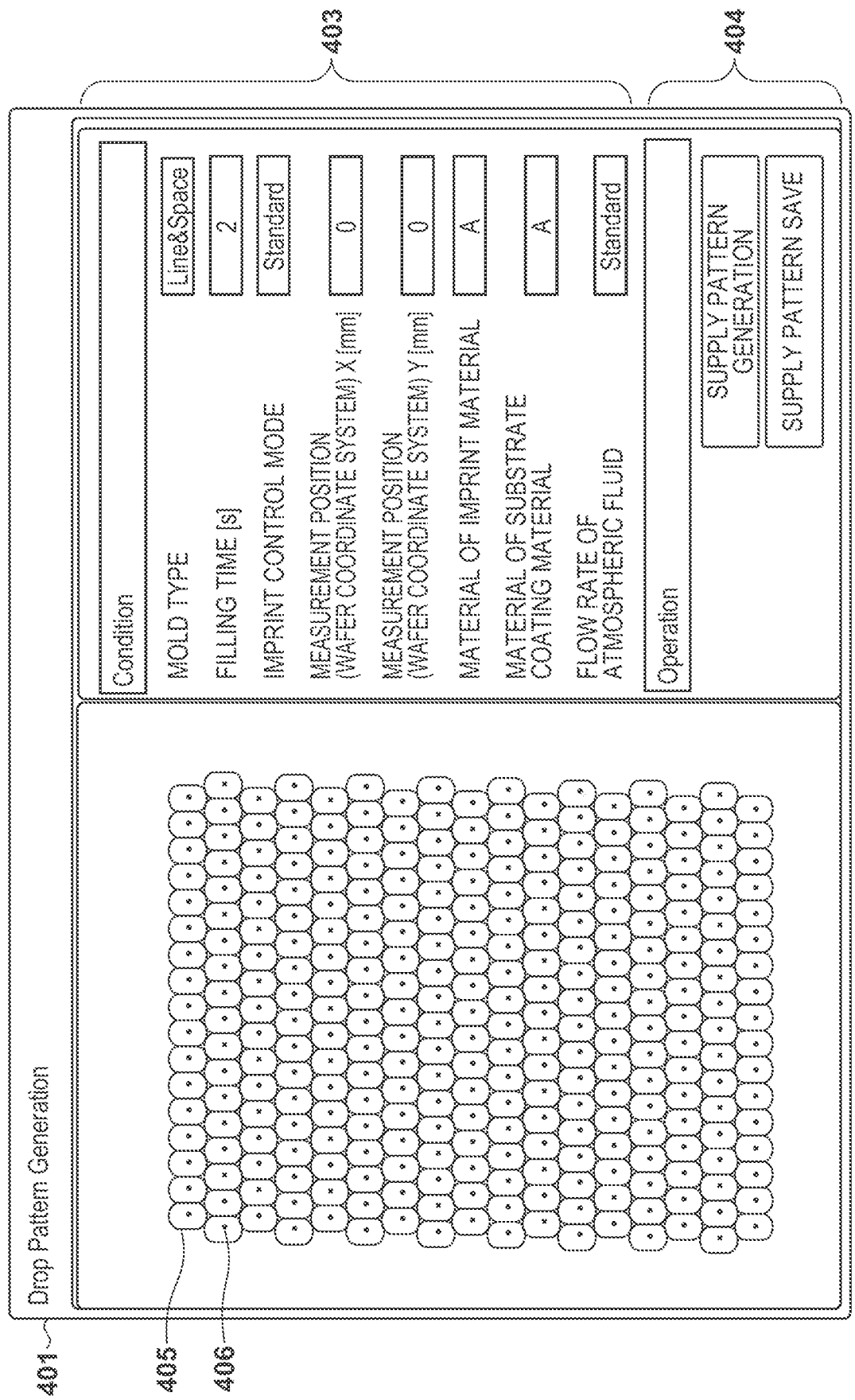
FIG. 19 is a view showing an example of a screen which is displayed in application pattern generation processing.

The third embodiment will describe a graphical user interface provided to a user in the processing for generating a supply pattern RP. FIG. 19 shows an example of a screen 401 displayed by a display device 112 at the generation of the supply pattern RP according to this embodiment. The screen 401 is displayed on the display device 112 so as to reflect a result from the arithmetic processing performed by a controller CNT or a console unit CONS. The user can view the screen 401 and make an operation via an input device 113.

The screen 401 can include a display region 402 for the generated supply pattern RP, an input region 403 for imprint conditions, and an operation portion 404. A first user interface screen that can accept the values of the respective imprint conditions is displayed in the input region 403. The user can input, via the input region 403, the mold type, the filling time, the imprint control mode, the X- and Y-coordinates of the measurement position (substrate coordinate system), the material of the imprint material, the material of the substrate coating material, and the flow rate of atmospheric fluid.

The operation portion 404 can include a supply pattern generation button and a supply pattern save button. The supply pattern determination processing as shown in FIG. 10 is executed when the supply pattern generation button is pressed.

The display region 402 displays a second user interface screen that displays an image 406 of droplets arranged in accordance with the determined supply pattern and an image 405 of the estimated spread shapes of the droplets. By displaying the image 405 of the estimated spread shapes in this manner, it is possible to visually confirm the degree of gaps between adjacent imprint material droplets and to evaluate the generated supply pattern. The supply pattern save button can be pressed to save the supply pattern RP as a file in the console unit CONS or the memory 2.

In this manner, the estimated spread shapes can be displayed on the image 405 to verify the calculated supply pattern, and thus the efficiency of the supply pattern generation operation is improved.

Fourth Embodiment

The above-described first to third embodiments described an imprint apparatus that forms an imprint material pattern on a substrate by bringing a mold and an imprint material on the substrate into contact with each other. However, the present invention is also applicable to a planarized layer forming apparatus that forms a planarized layer on a substrate. The planarized layer forming apparatus forms a planarized layer on a substrate using a mold (flat template) on which no pattern is formed. The underlying pattern on the substrate has a concave-convex profile derived from a pattern formed in a previous step. More particularly, a process substrate may have a step of about 100 nm in accordance with the advancement of the multilayer structure of memory elements in recent years. The step derived from the moderate undulation of the entire substrate can be corrected by a focus tracking function of a scan exposure apparatus used in a photo process. However, the fine concave-convex portions having a pitch small enough to fall within the exposure slit area of the exposure apparatus will directly consume the DOF (Depth Of Focus) of the exposure apparatus. As a conventional method of planarizing the underlying pattern of a substrate, a method of forming a planarized layer, such as SOC (Spin On Carbon) or CMP (Chemical Mechanical Polishing) is used. However, problematically, the conventional technique cannot obtain a sufficient planarization performance, and the concave-convex difference of the underlayer caused by multilayer formation tends to increase.

To solve this problem, the planarized layer forming apparatus according to this embodiment presses the flat template (planarizing plate) against an uncured resist material (imprint material) applied in advance to the substrate to perform local planarization within the substrate surface. The arrangement of the planarized layer forming apparatus according to this embodiment is almost the same as the imprint apparatus shown in FIG. 1. The planarized layer forming apparatus uses, as a mold M of FIG. 1, a planarizing plate whose area is equal to or larger than the area of the substrate. The planarizing plate has a flat surface and does not include a concave-convex pattern such as that formed in the mold M. The resist material is cured in a state in which this planarizing plate is in contact with the entire surface of the resist material on the substrate, and the planarizing plate is separated from the cured resist material. As a result, a planarized resist layer will remain on the surface of the substrate. The processing for determining the resist material pattern as those described above in the first to third embodiments is applicable to such a planarized layer forming apparatus.

<Embodiment of Method of Manufacturing Article>

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

A method of manufacturing an article will be described next. As shown step SA of FIG. 20, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 20:
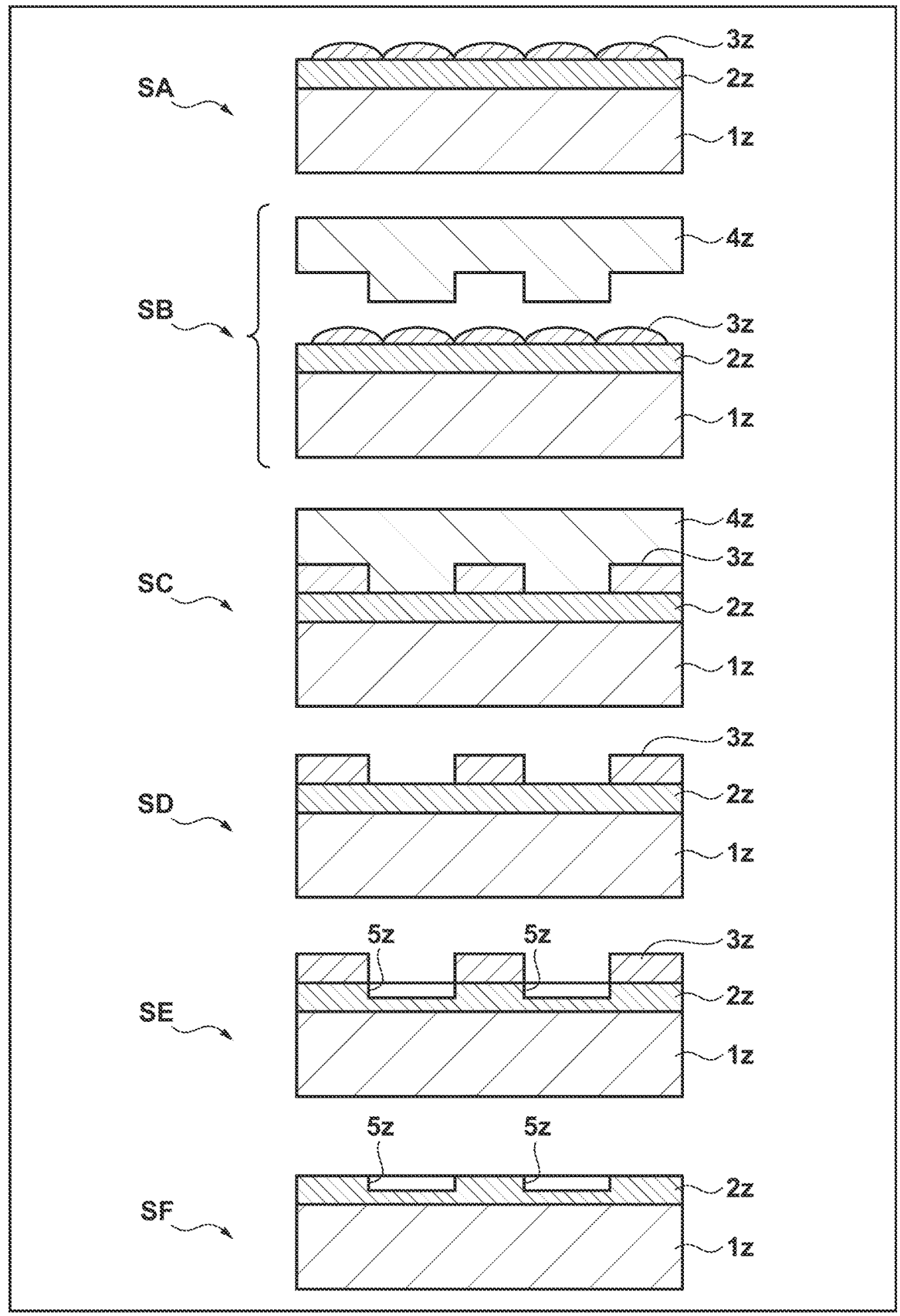
FIG. 20 is view for explaining an article manufacturing method according to an embodiment.

As shown in step SB of FIG. 20, a side of a mold 4z for imprint with an uneven pattern is directed toward and made to face the imprint material 3z on the substrate. As shown in step SC of FIG. 20, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

As shown in step SD of FIG. 20, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

As shown in step SE of FIG. 20, when etching is performed using the pattern of the cured product as an etching resistant mask, a portion of the surface of the processed material 2z where the cured product does not exist or remains thin is removed to form a groove 5z. As shown in step SF of FIG. 20, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-095633, filed May 17, 2018, which is hereby incorporated by reference herein in its entirety.

What is claimed is:

1. An information processing apparatus, the apparatus comprising:
   a processor configured to
      obtain a geometric feature amount of a droplet of a material on a substrate, related to a spread of the droplet of the material on the substrate, based on an image of a first plurality of droplets of the material captured by an image capturing unit while the material and a template are in contact with each other to form the material in a forming condition,
      obtain correspondence relationship data between forming conditions when the material and the template are in contact with each other to form the material and geometric feature amounts related to the spread of the droplet of the material on the substrate,
      obtain, from the obtained correspondence relationship data between the forming conditions and the geometric feature amounts, a geometric feature amount corresponding to a set forming condition,
      obtain a spread shape of an initial droplet of the material based on the obtained geometric feature amount corresponding to the set forming condition,
      obtain spread shapes of a second plurality of droplets of the material based on the obtained geometric feature amount corresponding to the set forming condition, and
      determine arrangement data of the material that indicates positions where the material is to be supplied on a substrate by adjusting positions of the spread shapes of the second plurality of droplets, based on an area of a polygon obtained by connecting centers of gravity of the obtained spread shapes of the second plurality of droplets of the material and a center of gravity of the spread shape of the initial droplet of the material, such that the spread shapes of the second plurality of droplets and the spread shape of the initial droplet contact with each other.

2. The apparatus according to claim 1, further comprising a memory configured to store the correspondence relationship data.

3. The apparatus according to claim 1, wherein when one droplet of the first plurality of droplets, is approximated by a circle based on an image of the one droplet captured by the image capturing unit, a geometric feature amount of the one droplet includes a diameter of the circle.

4. The apparatus according to claim 1, wherein the a geometric feature amount of one droplet of the first plurality of droplets includes a major axis length, a minor axis length, a radius of curvature, and a tilt of an ellipse when the one droplet, of the first plurality of droplets, is approximated by an ellipse based on an image of the one droplet captured by the image capturing unit.

5. The apparatus according to claim 1, wherein the forming condition includes at least one of a type of the template, a filling time set for filling a pattern of the template with the material by bringing the material and the template in contact with each other, a relative speed of movement between the material and the template at the contact, a substrate position of a region to be captured by the image capturing unit, information of the material, information of a substrate coating material, and a flow rate of an atmospheric gas in a position where the contact is to be performed.

6. The apparatus according to claim 1, wherein the processor determines the arrangement data by adjusting positions of the spread shapes of the second plurality of droplets so that the area of the polygon, obtained by connecting the centers of gravity of the obtained spread shapes of the second plurality of droplets and the center of gravity of the spread shape of the initial droplet, is minimized.

7. A determination method of determining arrangement data of a material that indicates positions where the material is to be supplied on a substrate, the method comprising following steps of:
   obtaining a geometric feature amount of a droplet of the material on a substrate, related to a spread of the droplet of the material on the substrate, based on an image of a first plurality of droplets of the material captured by an image capturing unit while the material and a template are in contact with each other to form the material in a forming condition,
   obtaining correspondence relationship data between forming conditions when the material and a template are in contact with each other to form the material and geometric feature amounts related to the spread of the droplet of the material on the substrate,
   obtaining, from the obtained correspondence relationship data between the forming conditions and the geometric feature amounts, a geometric feature amount corresponding to a set forming condition,
   obtaining a spread shape of an initial droplet of the material based on the obtained geometric feature amount corresponding to the set forming condition,
   obtaining spread shapes of a second plurality of droplets of the material based on the obtained geometric feature amount corresponding to the set forming condition, and
   determining the arrangement data of the material that indicates positions where the material is to be supplied on the substrate by adjusting positions of the spread shapes of the second plurality of droplets, based on an area of a polygon obtained by connecting centers of gravity of the obtained spread shapes of the second plurality of droplets of the material and a center of gravity of the spread shape of the initial droplet of the material, such that the spread shapes of the second plurality of droplets and the spread shape of the initial droplet contact with each other.

* * * * *